United States Patent [19]

Keys et al.

[11] Patent Number: 4,636,453

[45] Date of Patent: Jan. 13, 1987

[54] PHOTOPOLYMER FILMS CONTAINING MICROENCAPSULATED SENSITOMETRIC ADJUVANTS

[75] Inventors: Dalen E. Keys; William J. Nebe, both of Wilmington, Del.

[73] Assignee: E. I. Du Pont de Nemours and Company, Wilmington, Del.

[21] Appl. No.: 782,424

[22] Filed: Oct. 1, 1985

[51] Int. Cl.$^4$ .............................. G03C 1/68; G03F 7/16
[52] U.S. Cl. .................................... 430/138; 430/270; 430/281; 430/935
[58] Field of Search ............... 430/138, 270, 281, 435

[56] References Cited

U.S. PATENT DOCUMENTS

| | | | |
|---|---|---|---|
| 3,219,446 | 11/1965 | Berman | 430/138 |
| 3,700,439 | 10/1972 | Phillips | 430/138 |
| 4,399,209 | 8/1983 | Sanders et al. | 430/138 |
| 4,416,966 | 11/1983 | Sanders et al. | 430/138 |
| 4,440,846 | 4/1984 | Sanders et al. | 430/138 |
| 4,482,624 | 11/1984 | Arney et al. | 430/138 |
| 4,501,809 | 2/1985 | Hiraishi et al. | 430/138 |
| 4,532,200 | 7/1985 | Arney et al. | 430/138 |

FOREIGN PATENT DOCUMENTS

| | | |
|---|---|---|
| 2533684 | 6/1984 | Australia . |
| 134300 | 3/1985 | European Pat. Off. . |
| 2109331A | 6/1983 | United Kingdom . |

*Primary Examiner*—Richard L. Schilling

[57] ABSTRACT

Photopolymerizable elements comprising a support, a layer of a photopolymerizable composition and a protective layer, the photopolymerizable layer having in reactive association therewith, e.g., dispersed therein or in contact with the surface, pressure rupturable microcapsules containing therein at least one active component for the photopolymerizable composition, e.g., ethylenically unsaturated compound, sensitizer, photoinitiator, oxygen scavenger, and plasticizer. Processes for the preparation of an activated photopolymerizable element and use are described wherein the microcapsules are ruptured, i.e., prior to imagewise exposure and development. The photopolymerizable elements are useful as color proofs, printing plates, etc.

23 Claims, No Drawings

PHOTOPOLYMER FILMS CONTAINING MICROENCAPSULATED SENSITOMETRIC ADJUVANTS

DESCRIPTION

1. Technical Field

This invention relates to photopolymerizable elements having in reactive association rupturable microcapsules. This invention also relates to a process for the preparation of an activated photopolymerizable element.

2. Background Art

Photopolymerizable elements comprising a support bearing a layer of a photopolymerizable composition with a protective coversheet or layer thereover are well-known in the fields of image reproduction and photofabrication. In use, formulated photopolymerizable elements may be imagewise exposed and developed to produce printing plates or color proofs, etc. Generally the photopolymerizable compositions used in such elements comprise polymeric organic binders, ethylenically unsaturated compounds (monomers), photoinitiators or photoinitiator systems as well as other active components which improve the speed and/or physical properties of the photopolymerizable composition. All components generally are present in a photopolymerizable composition when it is applied to a support, e.g., by coating, lamination, or other known means, to form the element. Compatibility of the various components in photopolymerizable elements can be a problem. In many instances extreme care must be used to prevent the element from becoming polymerized prior to the desired time. For example, the element must not be exposed to any actinic radiation prior to the imagewise exposure through the phototool desired to be used by the artisan. It is possible to prematurely polymerize photopolymerizable elements by exposure to daylight for a short period of time.

Microcapsules, e.g., pressure rupturable microcapsules, which have solvent resistant outer walls surrounding active components are known. Several procedures have been described for preparing various types of microcapsules, e.g., Wurster U.S. Pat. No. 2,648,609 (fluidized bed), Vandegaer U.S. Pat. No. 3,577,515 and Ruus U.S. Pat. No. 3,429,827 (interfacial polymerization), Macauley U.S. Pat. No. 3,016,308 (urea/formaldehyde condensation), Green U.S. Pat. No. Re. 24,899 (coacervation), Chao U.S. Pat. No. 4,495,509 (interchange of emulsions), Brynko U.S. Pat. No. 2,969,331 (dual-walled). There are a large number of patents which describe the preparation and use of microcapsules which rupture and release material enclosed by the microcapsule.

Photosensitive materials employing microencapsulated radiation sensitive compositions are the subject of U.S. Pat. Nos. 4,399,209 and 4,440,846 assigned to The Mead Corporation.

Berman, U.S. Pat. No. 3,219,446 discloses a transfer imaging process in which a blue-black dye is encapsulated with a photocrosslinkable polymer or a photopolymerizable monomer in a film or a layer of discrete microcapsules.

Phillips, U.S. Pat. No. 3,700,439, discloses a process wherein Michler's ketone is encapsulated in a conventional manner and provided as a layer on a support.

Microcapsules, e.g., pressure rupturable microcapsules, which have solvent resistant outer walls surrounding active components or outer walls with reduced permeability are known. British Patent Publication No. 2,109,331A discloses that microcapsules resistant to solvent action can be prepared with either (i) at least two prepolymers selected from a melamine/formaldehyde prepolymer, a thiourea/formaldehyde prepolymer and a melamine/thiourea/formaldehyde prepolymer or (ii) a melamine/thiourea/formaldehyde prepolymer, which are suitable for selective release of color formers in an area where pressure is applied.

Australian Pat. No. 25336/84 discloses that microcapsules can be prepared with reduced permeability by treatment of microcapsule walls with a reaction product of formaldehyde and a member from a group of disclosed hydroxylated organic aromatic compounds.

The aforementioned inventions are directed to reproduction paper and color imaging systems using solvent resistant and pressure rupturable microcapsules. There is no indication how microcapsule technology can be employed or serve a useful purpose in photopolymerizable elements. This is surprising since it has long been known that lack of compatibility of the many components in a photopolymerizable composition can be troublesome. It is desirable that the above disadvantages be overcome and that photopolymerizable elements be prepared which possess improved properties, such as increased shelf-life, reduced edge-fusion, improved adhesion, increased film speeds, expanded range raw materials, expanded spectral sensitivity while maintaining room light stability (until the microcapsules are ruptured).

DISCLOSURE OF THE INVENTION

In accordance with this invention there is provided in a photopolymerizable element comprising a support bearing, in order, a layer of a photopolymerizable composition, and a protective layer, the improvement wherein the photopolymerizable layer has in reactive association therewith pressure rupturable microcapsules consisting essentially of outer walls resistant to solvent for the photopolymerizable layer surrounding at least one active component for the photopolymerizable composition which improves the speed and/or physical properties of the photopolymerizable composition.

In accordance with another embodiment of this invention there is provided a process for the preparation of an activated photopolymerizable element which comprises:

(a) applying to a support a layer of a photopolymerizable composition having dispersed therein pressure rupturable microcapsules consisting essentially of outer walls resistant to solvent for the photopolymerizable layer surrounding at least one active component for the photopolymerizable composition which improves the speed and/or physical properties of the photopolymerizable composition;

(b) drying the photopolymerizable layer;

(c) optionally applying a protective layer over the photopolymerizable layer; and (d) applying sufficient pressure to rupture substantially all the pressure rupturable microcapsules.

The photopolymerizable element of this invention comprises (1) a support, (2) a layer of a photopolymerizable composition containing a polymeric organic binder, a nongaseous ethylenically unsaturated compound (monomer), (3) a photoinitiator or photoinitiator system as well as other known adjuvants, and a protective layer, e.g., coversheet or dry polymeric coating. The photopolymerizable layer has in reactive association, e.g., dispersed therein, in contact with the layer, microcapsules as defined above containing therein at least one active component for the photopolymerizable composition which improves the photospeed and/or physical properties of the photopolymerizable composition, e.g., at least one compound which is a nongaseous ethylenically unsaturated compound, sensitizer, photoinitiator or photoinitiator system, oxygen scavenger, and plasticizer. Generally the microcapsules can contain therein one or more of the active components for the photopolymerizable layer. It is not advisable, however, to encapsulate the ethylenically unsaturated compound and photoinitiator since these components are capable of premature polymerization while in encapsulated form. If extreme care is taken, however, a suitable monomeric compound/photoinitiator combination microcapsule can be prepared, e.g., the photoinitiator is not activatable under daylight conditions or under storage conditions.

The term "microcapsule" as used throughout the specification means hardened polymer walls or shells containing one or more ingredients which can improve physical and/or sensitometric properties of a photopolymerizable element, including but not limited to the capability of supplying one of the essential ingredients to produce a photopolymerizable composition, i.e., ethylenically unsaturated compound and photoinitiator. The microcapsules are required to be pressure rupturable in order to fulfill the requirements of the present invention. The microcapsules must have outer walls of sufficient strength to contain an active component for the photopolymerizable layer during handling and coating operations, but the walls must fracture under applied pressure when the element is drawn, with pressure exerted downward, under a blunt hard surface with smooth rounded edges, e.g., hard surface with dimensions of about 0.5 cm × 2.0 cm. In the situation where a photopolymerizable element is to be prepared by coating from an organic solvent, it is required that the microcapsules be resistant to attack by such solvent.

"Microencapsulation" as used throughout the specification means a process by which one or more ingredients become encased in a hardened polymer. The discrete walled microcapsules used in the present invention can be produced using known encapsulation techniques including coacervation, interfacial polymerization, polymerization of one or more monomers in an oil, etc. Representative examples of suitable wall-formers are gelatin materials (see U.S. Pat. Nos. 2,730,456 and 2,800,457 to Green et al) including gum arabic, polyvinyl alcohol, carboxy-methyl-cellulose; resorcinol-formaldehyde wall-formers (see U.S. Pat. No. 3,755,190 to Hart et al); isocyanate wall-formers (see U.S. Pat. No. 3,914,511 to Vassiliades); isocyanatepolyol wall-formers (see U.S. Pat. No. 3,796,669 to Kirintani et al); urea formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al); melamine-formaldehyde resin and hydroxypropyl cellulose (see U.S. Pat. No. 4,025,455 to Shackle); and emulsion interchange (See U.S. Pat. No. 4,495,509 to Chao). These patents are incorporated herewith by reference.

For the systems in this work urea/resorcinol/formaldehyde is the preferred wall material.

The internal phase of the microcapsules is a water immiscible oil. High boiling organics are useful, e.g., dibutyl phthalate, dimethyl phthalate, tricresyl phosphate, isopropylnaphthalene, diisopropylnaphthalene, polyfunctional acrylate or methacrylate monomers, etc. Other substances that can be used include: castor oil, olive oil, alkylated biphenyls, dibutyl fumerate, mineral oil, and brominated paraffin, etc.

The active component(s) for the photopolymerizable composition present in the microcapsules includes: nongaseous ethylenically unsaturated compounds, sensitizers, photoinitiators or photoinitiator systems, oxygen scavengers and plasticizers. Examples of these active components are set out below.

The size of the microcapsules ranges from 0.1 to 25 $\mu$m, preferably 1.0 to 10 $\mu$m. Conventional microscopic examination, scanning electron microscopy, and particle size measurement techniques such as the Coulter ® Counter can be used to determine the sizes of the microcapsules and also measure size distribution. About 5 to 40% of the total microcapsule weight constitutes wall material. The shape of the microcapsules is preferably in uniform spheres although other forms can be used provided that they are sufficiently rupturable.

Photopolymerizable elements are known and contain as essential ingredients in the photopolymerizable layer: polymeric organic binder, ethylenically unsaturated compound and photoinitiator. Other useful additives include: inhibitors, leuco dyes, photoinhibitors, accelerators such as chain transfer agents, oxygen scavengers, plasticizers, dyes and pigments to increase visibility of the image, sensitizers, fillers, etc.

The ethylenically unsaturated compound (monomer) can be present in the photopolymerizable composition in an amount of 3 to 100 parts by weight, and the organic polymeric binder can be present in an amount of 0 to 97 parts by weight based on the total weight of monomer and binder. The photoinitiator can be present in an amount of 0.001 to 20 parts by weight per 100 parts by weight of the combined weight of ethylenically unsaturated compound and binder. The other additives can be present in minor amounts known to those skilled in the art.

The ethylenically unsaturated compounds (photopolymerizable monomers of this invention) have a boiling point above 100° C. at normal atmospheric pressure and are capable of forming a high molecular weight polymer by photoinitiated, addition polymerization. Suitable compounds are disclosed in Chang U.S. Pat. No. 3,756,827, column 2, line 36 to column 3, line 30, the disclosure of which is incorporated herein by reference. Other useful monomers include ethylenically unsaturated diester polyhydroxy polyethers as described in Chambers U.S. Pat. No. 4,245,031. Examples include the Epocryl ® resins sold by Shell Chemical Co. Many of the polymerizable monomers are subject to thermal polymerization, especially when stored for long periods or at elevated temperatures. When such compounds are supplied commercially, it is customary for them to contain a small, but effective, amount of a thermal polymerization inhibitor. These inhibitors may be left in the monomers when the photopolymerizable coating compositions of this invention are prepared. The resulting compositions usually have satisfactory thermal stability. If unusual thermal exposure is anticipated, or if monomers containing little or no thermal polymerization inhibitor are employed, compositions with adequate shelf life can be obtained by incorporating, e.g., up to 0.5 percent, by weight of monomer, of a thermal polymerization inhibitor such as hydroquinone, methylhydroquinone, p-methoxyphenol, etc. Preferred ethylenically unsaturated compounds are polyethylene glycol diacrylate, tetraethylene glycol diacrylate and polyoxyethylated trimethylolpropane triacrylate, trimethylolpropane triacrylate, and trimethylolpropane trimethacrylate.

Useful photoinitiators compound types include: hexaarylbiimidazole compounds which are preferred, 4-trichloromethyl-4-methyl-2,5-cyclohexadienones, quinones, alkylaryl ketones and benzophenones. The biimidazoles are photodissociable to the corresponding triarylimidazolyl radicals. These hexaarylbiimidazoles absorb maximally in the 255-275 nm region, and usually show some, though lesser absorption in the 300-375 nm region. Although the absorption bands tend to tail out to include wavelengths as high as about 430 nm, they normally require light rich in the 255-375 nm wavelengths for their dissociation.

The hexaarylbiimidazoles can be represented by the formula:

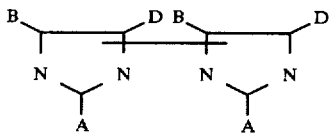

wherein A, B and D represent aryl groups which can be the same or different, carbocyclic or heterocyclic, unsubstituted or substituted with substituents that do not interfere with the dissociation of the hexaarylbiimidazole to the triarylimidazolyl radical or with the oxidation of a leuco dye which may be present, and each dotted circle stands for four delocalized electrons (i.e., two conjugated double bonds) which satisfy the valences of the carbon and nitrogen atoms of the imidazloyl ring. The B and D aryl groups can each be substituted with 0-3 substituents and the A aryl groups can be substituted with 0-4 substituents. Useful 2,4,5-triarylimidazolyl dimers are disclosed in Baum & Henry U.S. Pat. No. 3,652,275 column 5, line 44 to column 7, line 16, the disclosure of which is incorporated herein by reference.

Useful quinone types are: camphorquinone, substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, 1,2,3,4-tetrahydronaphthacenequinone, and 1,2,3,4-tetra-hydronbenz(a)anthracene-7-,12-dione.

Useful alkylaryl ketones include: vicinal ketaldonyl alcohols such as benzoin, pivaloin, acryloin ethers, e.g., benzoin methyl ether, benzoin ethyl ether, benzoinisopropyl ether, benzoin sec-butyl ether, benzoin isobutyl ether, benzoin n-butyl ether; α-hydrocarbon-substituted aromatic acryloins, including α-methylbenzoin, α-allylbenzoin and α-phenylbenzoin, benzoin dialkyl ketals such as benzil dimethylketal, benzil ethyleneglycol ketal, benzil, benzoin esters such as O-acetyl benzoin and O-acylated oximinoketones such as 1-phenyl-1,2-propanedione-2-O-benzoyloxime.

Benzophenones useful as photoinitiators include: benzophenone, 4,4'-dichlorobenzophenone, fluorenone, anthrone, thioxanthone, xanthone, Michler's ketone, 4-dimethoxyaminobenzophenone, 4-morpholinobenzophenone.

4-Trichloromethyl-4-methyl-2,5-cyclohexadienone compounds useful in this invention are disclosed in Sysak U.S. Pat. No. 4,341,860, the disclosure of which is incorporated by reference.

Preferred initiators are benzoin methyl ether, Michler's ketone, and benzophenone.

Thermoplastic macromolecular organic polymeric binders are present in the photopolymerizable compositions. Polymeric binder types include: (a) copolyesters based on terephthalic, isophthalic, sebacic, adipic and hexahydroterephthalic acids; (b) nylons or polyamides; (c) vinylidene chloride copolymers; (d) ethylene/vinyl acetate copolymers; (e) cellulosic ethers; (f) polyethylene; (g) synthetic rubbers; (h) cellulose esters; (i) polyvinyl esters including polyvinyl acetate/acrylate and polyvinyl acetate/methacrylate copolymers; (j) polyacrylate and poly-α-alkyl-acrylate esters, e.g., polymethyl methacrylate and polyethyl methacrylate; (k) high molecular weight ethylene oxide polymers (polyethylene glycols) having weight average molecular weights from 4000 to 4,000,000; (l) polyvinyl chloride and copolymers; (m) polyvinyl acetal; (n) polyformaldehydes; (o) polyurethanes; (p) polycarbonates; (q) polystyrenes, (r) block copolymers, e.g., AB and ABA (styrene-isoprene-styrene) types.

In a particularly preferred embodiment of the invention, the polymeric binder is selected so that the unexposed photopolymerizable coating is soluble in predominantly aqueous solutions, for example dilute aqueous alkaline solutions, but upon exposure to actinic radiation becomes relatively insoluble therein. Typically, polymers which satisfy these requirements are carboxylated polymers, for example vinyl addition polymers containing free carboxylic acid groups, hydroxylated polymers, such as polyvinyl alcohols. The preferred binders are the polyvinyl alcohols and copolymers of styrene/maleic anhydride partially esterified with an isobutanol mixture, e.g., acid no. ca. 190, wt. ave. mol. wt. ca. 10,000; and a combination of a copolymer of styrene/maleic anhydride and a terpolymer of ethyl acrylate/methylmethacrylate/acrylic acid. Another preferred group of binders includes polyacrylate esters and poly-α-alkylacrylate esters, particularly polymethyl methacrylate.

Optionally leuco dyes can also be present in the photopolymerizable composition. By the term "leuco dye" is meant the colorless (i.e., the reduced) form of a dye compound which can be oxidized to its colored form by the triarylimidazolyl radical. Leuco dyes are disclosed in Baum and Henry U.S. Pat. No. 3,652,275, column 7, line 24 to column 11, line 32, the disclosure of which is incorporated herein by reference.

In preferred positive working photopolymerizable compositions, nitroaromatic photoinhibitors as disclosed in Belgian Pat. No. 852,517 granted Sept. 16, 1977, are present. These compounds which can be present in amounts of 0.5 to 15 parts by weight per 100 parts by weight of the combined weight of ethylenically unsaturated compound and binder are defined by the formula:

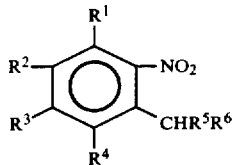

wherein
$R^1$ is H, $R^4$ is H, $R^2$ and $R^3$ are alike or different, are H, OH, halogen, $NO_2$, CN, alkyl of 1 to 18 carbons, alkoxy in which the alkyl is of 1 to 18 carbons, aryl of 6 to 18 carbons, benzyl, halogen-substituted phenyl, polyether of 2 to 18 carbons and 1 to 6 oxygens, dialkylamino in which each alkyl is of 1 to 18 carbons, thioalkyl in which the alkyl is of 1 to 18 carbons, or thioaryl in which the aryl is of 6 to 18 carbons, or any two of $R^1$, $R^2$, $R^3$, $R^4$, taken together, are the residue of a second benzene ring fused onto the benzene nucleus, with the proviso that not more than one of $R^2$ and $R^3$ is OH or $NO_2$;
$R^5$ is H, alkyl of 1 to 18 carbons, halogen, phenyl, or alkoxy in which the alkyl is of 1 to 18 carbons;
$R^6$ is H, OH, alkyl of 1 to 18 carbons, phenyl, or alkoxy in which the alkyl is of 1 to 18 carbons, with the proviso that only one of $R^5$ and $R^6$ is H, or;
$R^5$ and $R^6$ together are =O, =$CH_2$, —O—$CH_2$—; =$NC_6H_5$, =$NC_6H_4N(alkyl)_2$ in which each alkyl is of 1 to 18 carbons, —O—$C_2H_4$—O—,

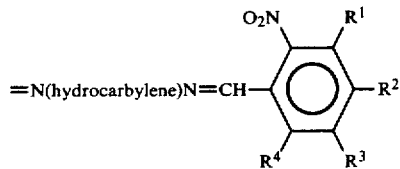

in which the hydrocarbylene group is of 1 to 18 carbons, or

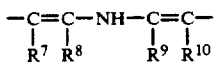

in which $R^8$ and $R^9$, alike or different, are H or alkyl of 1 to carbons, and $R^7$ and $R^{10}$, alike or different, are —CN, —$COR^{11}$ in which $R^{11}$ is alkyl of 1 to 5 carbons, or —$COOR^{12}$ in which $R^{12}$ is alkyl of 1 to 6 carbons which may be interrupted by an oxygen atom, alkenyl of 2 to 5 carbons, alkynyl of 2 to 5 carbons, or $R^7$ and $R^8$ together, or $R^9$ and $R^{10}$ together, complete a 6-membered carbocyclic ring containing a keto group.

Accelerators or reducing agents such as oxygen scavengers and active hydrogen doners acting as chain transfer agents are useful additions to compositions to improve photospeed. Oxygen scavengers that have been found to be useful are organophosphines, organophosphonates, organophosphites, stannous salts and other compounds that are easily oxidized by oxygen. Useful chain transfer agent are N-phenyl glycine, trimethylbarbituric acid, 2-mercaptobenzoxazole, 2-mercaptobenzothiazole, and other compounds that have hydrogens that are readily abstractable by radicals. A preferred oxygen scavenger is triphenylphosphine.

A wide range of nonpolymerizable plasticizers are effective in achieving improved exposure and development temperature latitude. When a macromolecular binder is present in the layer, plasticizer selection would be based on those well known in the art to be compatible with it as well as the monomer, dimer, ketone and other components. With acrylic binders, for example, dibutyl phthalate and other esters of aromatic acids; esters of aliphatic polyacids such as diisooctyl adipate, nitrate esters, etc.; aromatic or aliphatic acid esters of glycols, polyoxyalkylene glycols, aliphatic polyols, etc.; alkyl and aryl phosphates; low molecular weight polyester of poly-α-methylstyrenes; chlorinated paraffins; and sulfonamide types may be used. Other inert additives such as dyes, pigments and fillers are known to those skilled in the art. These additives are generally present in minor amounts and should not interfere with the exposure of the photopolymerizable layer.

Suitable sensitizers include those disclosed in Dueber U.S. Pat. No. 4,162,162, column 4, line 56 to column 6, line 65, and Anderson U.S. Pat. Nos. 4,268,667 and 4,351,893 incorporated herein by reference, and polymeric sensitizers disclosed in Dueber and Monroe, U.S. Ser. No. 673,924, filed Nov. 21, 1984.

The photopolymerizable compositions described herein may be coated on a wide variety of substrates. By "substrate" is meant any natural or synthetic support, preferably one which is capable of existing in a flexible or rigid film or sheet form. For example, the substrate could be a metal sheet or foil, a sheet or film of synthetic organic resin, cellulose paper, fiberboard, and the like, or a composite of two or more of these materials. Specific substrates include alumina-blasted aluminum, anodized aluminum, alumina-blasted polyethylene terephthalate film, polyethylene terephthalate film, e.g., resin-subbed polyethylene terephthalate film, flame or electrostatic discharge treated polyethylene terephthalate film, polyvinyl alcohol-coated paper, crosslinked polyester-coated paper, nylon, glass, cellulose acetate film, heavy paper such as lithographic paper, and the like.

The particular substrate will generally be determined by the use application involved. For example, when printed circuits are produced, the substrate may be a plate which is a copper coating on fiberboard; in the preparation of lithographic printing plates, the substrate is anodized aluminum.

Preferably the layer of the photopolymerizable compositions have a thickness ranging from about 0.0001 inch (~0.0003 cm) to about 0.01 inch (0.025 cm) and are adhered with low to moderate adherence to a thin, flexible, polymeric film support which may transmit radiation actinic to the photopolymerizable layer. The opposite side of the photopolymerizable layer may have adhered thereto a protective cover layer or coversheet wherein the sheet has less adherence to the layer than the adherence between the film support and the layer. A particularly preferred support is a transparent polyethylene terephthalate film having a thickness of about 0.001 inch (~0.0025 cm). Polyethylene, 0.001 inch (~0.0025 cm) is a preferred coversheet; polyvinyl alcohol coating is a preferred cover layer.

The photopolymerizable element of the present invention as described above preferably contains dispersed in the photopolymerizable layer the pressure rupturable microcapsules, or the microcapsules can be present on the support or coversheet or layer so that they can contiguous to the photopolymerizable layer. The procedures by which the microcapsules are incorporated into the photopolymerizable element are known to those skilled in the art.

The photopolymerizable element is prepared by applying to a suitable support a layer of photopolymerizable composition. The photopolymer can be applied by coating, lamination, calendering, etc., as known to those skilled in the art. The means of applying is dependent on the particular composition. The photopolymer layer is then dried and, if a protective layer is to be present such a layer is applied either in sheet or film form, e.g., by lamination, or as a coated layer. Prior to imagewise exposure and development the photopolymerizable element is activated, e.g., by the application of mechanical pressure as described above. Such mechanical pressure applicator means in addition to manual pressure include pressures provided by laminators, nip rolls, etc. Since many photofabrication processes are now or being automated, pressure application can be incorporated as part of a lamination step or while transporting the photopolymerizable element into an exposure device.

After activation, i.e., rupturing of the microcapsules, the element is imagewise exposed to actinic radiation for the photoinitiator and/or sensitizer present in the photopolymerizable layer. Any convenient source of actinic radiation can be used that activates the photopolymerizable composition for radical formation, image formation and photopolymerization initiation.

Inasmuch as the free-radical generating systems activatable by actinic radiation generally exhibit their maximum sensitivity in the ultraviolet range, the radiation source should furnish an effective amount of this radiation, preferably having a wavelength range between about 2500 Å and 5000 Å. Suitable sources of such radiation, in addition to sunlight, include carbon arcs, mercury-vapor arcs, fluorescent lamps with ultraviolet radiation-emitting phosphors, argon glow lamps, electron flash units and photographic flood lamps. Of these, the mercury-vapor lamps, particularly the sun lamp or "black light" type, and the fluorescent sun lamps, are most suitable. Electron accelerators and electron beam sources through an appropriate mask may also be used.

The radiation exposure time may vary from fractions of a second to minutes, depending upon the intensity and spectral energy distribution of the radiation source, its distance from the composition and the nature and amount of the composition available. Customarily, a mercury vapor arc or a sunlamp is used at a distance of about 1.5 to about 60 inches (3.8 to 153 cm) from the photosensitive composition. Exposure temperatures are not particularly critical, but it is preferred to operate at about ambient temperatures or slightly higher, i.e., about 20° to about 35° C.

After exposure development may be accomplished by solvent washout or toning, e.g., with pigment particles. Development with a solvent for the photopolymerizable layer may be carried out at about 25° C., but best results are sometimes obtained when the solvent is warm, e.g., 30° to 60° C. Development time can be varied but preferably is in the range of 0.1 to 4 minutes. In the development step where the image is formed, the solvent or toner may be applied in any convenient manner, as by pouring, immersion, spraying, roller application, or in the case of the latter also by dusting. After liquid development the plate is dried as known to those skilled in the art.

INDUSTRIAL APPLICABILITY

The photopolymerizable element having pressure rupturable microcapsules as described herein are useful in the fields of image reproduction and photofabrication. Specific uses are as printing plates, colorproofing films, etc. In particular, such photopolymerizable elements, e.g., wherein the photopolymerizable layer is coated from water, that contain microcapsulated oxygen scavenger, ultraviolet sensitizer, etc., exhibit speed enhancement upon rupturing the microcapsules. Interaction between the photopolymerizable composition and encapsulated activator compound is minimal prior to rupturing the microcapsules; therefore, the shelf life of the photopolymerizable elements is not affected. Cost savings in the preparation of photopolymerizable elements can be achieved primarily due to the formulation latitude offered by this invention.

In use, the particular adjuvant(s) in the microcapsules is released by pressure rupture of substantially all microcapsules present prior to the steps of imagewise exposure and development of the photopolymerizable element. Thus, the adjuvant(s) only exists in situ for a limited and controllable time between rupture of the microcapsules and the exposure and development. The physical and/or sensitometric properties of the photopolymerizable element is achieved without undesired in situ reaction of the adjuvants.

A significant technological advance is provided wherein a microencapsulated component represents one of the essential ingredients of a prephotopolymer composition. A photopolymerizable composition is created in situ by the pressure rupture release of the essential ingredient, i.e., monomeric compound or photoinitiator in reactive association with the layer of prephotopolymer. A coating composition or film can thus be handled under ambient conditions which would be unsatisfactory for a complete photopolymerizable coating composition or photopolymerizable film. For example, a coating solution of binder, photoinitiator, spectral sensitizer and microencapsulated monomeric compound can be exposed to ordinary light during manufacture of the element and the resulting element is likewise incapable of photopolymerization until the monomeric compound is released by pressure rupture immediately before exposure and development.

A specific advantage of the invention is that photopolymerizable elements can be provided in which otherwise incompatible combinations of components can coexist. The additional steps of microencapsulation and pressure rupture are more than balanced by the gain in physical and sensitometric properties.

EXAMPLES

The following Procedures and Examples illustrate the invention which is not limited thereby. Percentages therein are by weight. The polymeric molecular weights are expressed as number average molecular weights ($\overline{Mn}$). The $\overline{Mn}$ for the polymers described herein can be determined by gel permeation chromatography employing a polybutadiene standard or other standard known to those skilled in the art.

PREPARATION OF MICROCAPSULES

Procedure 1

In 425 ml of water was hydrolyzed 9.9 g of [poly(ethylene-co-maleic anhydride)]. $\overline{M}n$ 100,000, Monsanto, St. Louis, MO. The pH was adjusted to 3.5 and the solution was poured into a blending vessel. 10.4 g urea and 1.0 g resorcinol were added and dissolved with constant stirring. Into this aqueous solution was emulsified 196.6 g of oil phase composed of 19.5% triphenylphosphine dissolved in dibutyl phthalate (DBP). While heating to 60° C., 25 g of 37% formaldehyde solution was added to the reaction mixture. After heating at 60° C. for 2 hours the mixture was cooled to room temperature to complete the encapsulation process. The particle size distribution was determined to be 1 to 12 μm with a mean diameter of 5 μm.

Procedure 2

A 12.6 g portion of poly(ethylene-co-maleic anhydride) described in Procedure 1 was hydrolyzed in 300 ml water to yield a transparent solution. This solution was poured into a Waring blender, 6.1 g of gum arabic was added, and the pH was adjusted to 4.0 with 1N HCl. 20 g urea and 2.5 g resorcinol were added and the solution was heated to 55° C. Into this aqueous solution was emulsified 177.3 g of oil phase composed of 160.2 g DBP, 3.0 g Michler's ketone, 12.2 g benzophenone, and 1.9 g benzoin methyl ether (BME). 55.2 g of 37% formaldehyde solution was added, and the reaction mixture heated at 60° C. for 2 hours. After addition of a solution of 2.5 g ammonium sulfate in 38 g water the reaction mixture was heated for 1 hour at 60° C. During this period, the pH was no longer regulated at 4.0. At the end of this period the pH was adjusted to 9.0 with 1N NaOH, and 8.0 g sodium bisulfite was dissolved in the reaction mixture. Heating was maintained at 60° C. for 15 minutes. Thereafter, the reaction mixture was poured in a pyrex beaker and cooled to room temperature while stirring thus completing the encapsulation. The microcapsules were separated from the reaction solution by centrifugal separation. The collected microcapsules were washed with water by carrying out the centrifuging process twice and then redispersing the microcapsules in water. The particle size distribution was determined to be 1 to 9 μm with a mean diameter of 3 μm.

Procedure 3

Procedure 2 was repeated except for the following change:

After adjusting the pH to 4.0 with 1N HCl the solution was heated to 60° C. and the urea and resorcinol were added. Into the aqueous solution was emulsified 153.8 g of oil phase composed of 116.5 g DBP and 37.3 g BME.

Procedure 4

Procedure 3 was repeated except that into the aqueous solution at 60° C. was emulsified 154.8 g of DBP followed by the addition of 56.1 g of 37% formaldehyde solution.

Procedure 5

Procedure 3 was repeated except for the following changes:

1. To the 4 pH solution heated to 60° C. was added 20.6 g urea and 2.5 g resorcinol.

2. Into the aqueous solution described in 1 above was emulsified a 142.7 g aliquot of oil phase from a sample composed of 10.4 g BME dissolved in 134.9 g of trimethylolpropane trimethacrylate (TMPTMA).

3. 57.5 g of 37% formaldehyde solution was added to the emulsion described in 2.

4. After 3 above was heated for 2 hours, a solution of 2.9 g ammonium sulfate in 40.1 g water was added.

5. After adjusting the pH to 9.0, 8.2 g sodium bisulfite was added.

6. The particle size distribution was determined to be 1 to 13 μm with a mean diameter of 5 μm.

Procedure 6

A 13.2 g portion of poly(ethylene-co-maleic anhydride) described in Procedure 1 was hydrolyzed in 288 g water to yield a transparent solution. The resulting solution was poured into a Waring blender, 6.3 g gum arabic was added, and the pH was adjusted to 4.0 with 1N HCl. The solution was heated to 60° C. and 21.7 g urea and 2.7 g resorcinol were added. Into this aqueous solution was emulsified 152 g trimethylolpropane trimethacrylate. 55.7 g of 37% formaldehyde solution was added and the reaction mixture heated at 60° C. for 1 hour. Another 23.0 g of formaldehyde solution was added and heated for 1 hour. After adding a solution of 2.9 g ammonium sulfate in 40.5 g water, the reaction mixture was heated for another hour. The pH was adjusted to 9.0 with 1N NaOH, and 8.4 g sodium bisulfite was dissolved in the reaction mixture. Heating was maintained for 15 minutes with stirring. The reaction mixture was then poured into a pyrex beaker and cooled to room temperature thus completing the encapsulation process. Separation of the microcapsules was as described in Procedure 2. The particle size distribution was determined to be 1 to 9 μm with a mean diameter of 4 μm.

Procedure 7

A 12.6 g portion of poly(ethylene-co-maleic anhydride) described in Procedure 1 was hydrolyzed in 300 g water to yield a transparent solution. The resulting solution was poured into a Waring blender, 25.2 g gum arabic was added, and the pH was adjusted to 4.0 with 1N HCl. The solution was heated to 60° C. and 20.3 g urea and 2.8 g resorcinol were added. Into this aqueous solution was emulsified 139.9 g of oil phase composed of 59.6 g of BME dissolved in 80.3 g of isopropylnaphthalene. 56.3 g of 37% formaldehyde solution were added and the reaction mixture was heated at 60° C. for 2 hours. After adding a solution of 2.5 g ammonium sulfate in 38.5 g water, the reaction mixture was heated for another hour. The pH was adjusted to 9.0 with 1N NaOH, and 8.2 g sodium bisulfite was dissolved in the reaction mixture. Heating was maintained for 15 minutes while stirring. The reaction mixture was then poured into a pyrex beaker and cooled to room temperature thus completing the encapsulation process. Separation of the microcapsules was as described in Procedure 2. The particle size distribution was determined to be 1 to 13 μm with a mean diameter of 5 μm.

Procedure 8

In 100 mL of water 10 g of poly(ethylene-co-maleic anhydride), $\overline{M}n$ 25,000 (Monsanto, St. Louis, MO), was hydrolyzed by the addition of sodium hydroxide pellets. The pH was adjusted to about 7 by the addition of glacial acetic acid and the solution poured into a Waring blender containing 100 mL of water. Benzoin methyl ether (1.5 g) was dissolved in trimethylolpropanetrimethacrylate (20 g) and the cloudy solution filtered; 1,3,5-benzene tricarboxylic acid trichloride (4.0 g) was dissolved in the clear filtrate to produce the oil phase. The oil phase was added to the aqueous phase in the Waring blender and the blender run at low speed (50 v on the low setting) for 20 seconds to produce an emulsion. A solution of diethylene triamine (4 g), sodium bicarbonate (2 g), and sodium carbonate (8 g) in 200 mL of water was poured in and stirring continued at low speed for 1.25 hours. The microcapsules were separated from the reaction solution by centrifugal separation. The collected microcapsules were washed with water by carrying out the centrifuging process twice and then redispersing the microcapsules in water. The particle size distribution was estimated to be 2 to 10 μm.

Procedure 9

In 375 ml of water was hydrolyzed 5.8 g of [poly(ethylene-co-maleic anhydride)], $\overline{M}n$ 100,000, Monsanto, St. Louis, MO. The pH was adjusted to 3.5 and the solution was poured into a blending vessel. 19.9 g urea and 2.0 g resorcinol were added and dissolved with constant stirring. Into this aqueous solution was emulsified 165.3 g of oil phase composed of 17.7% triphenylphosphine dissolved in dibutyl phthalate. While heating to 55° C., 48.6 g of 37% formaldehyde solution was added to the reaction mixture. After heating at 55° C. for 2 hours the mixture was cooled to room temperature to complete the encapsulation process. The particle size distribution was determined to be 2 to 15 μm with a mean diameter of 6 μm.

Procedure 10

A 11.1 g portion of poly(ethylene-co-maleic anhydride) described in Procedure 1 was hydrolyzed in 300 mL water to yield a transparent solution. The resulting solution was poured into a Waring blender, 5.5 g gum arabic was added, and the pH was adjusted to 4.0 with 1N HCl. The solution was heated to 60° C. and 19.0 g urea and 2.4 g resorcinol were added. Into this aqueous solution was emulsified 173.7 g of oil phase composed of 21.4% triphenylphosphine dissolved in dibutyl phthalate. 55.4 g of 37% formaldehyde solution was added and the reaction mixture heated at 60° C. for 2 hours. After adding a solution of 2.2 g ammonium sulfate in 36 mL water, the reaction mixture was heated for another hour. The pH was allowed to decrease during this period to a finally about 3.4. The pH was adjusted 9.0 with 1N NaOH, and 8.2 g sodium bisulfite was dissolved in the reaction mixture. Heating was maintained for 15 minutes while stirring. The reaction mixture was poured into a pyrex beaker and cooled to room temperature thus completing the encapsulation process. Separation of the microcapsules was as described in Procedure 2. Freeze-dried a 100.0 g portion of the purified microcapsule slurry to obtain 23.2 g dry microcapsules. The particle size distribution was determined to be 1 to 6 μm with a mean diameter of 3 μm.

Procedure 11

A 13.3 g portion of poly(ethylene-co-maleic anydride) described in Procedure 1 was hydrolyzed in 201.6 g water to yield a transparent solution. The resulting solution was poured into a Waring blender, 8.0 g gum arabic was added, and the pH was adjusted to 3.0 with 1N HCl. The solution was heated to 60° C. and 21.5 g urea and 2.8 g resorcinol were added. Into this aqueous solution was emulsified 150 mL dibutyl phthalate. 58.1 g of 37% formaldehyde solution was added and the reaction mixture heated at 60° C. for 1 hour. Another 10.6 g of formaldehyde solution was added and heated for 1 hour. After adding a solution of 2.5 g ammonium sulfate in 46.7 g water, the reaction mixture was heated for another hour. The pH was allowed to decrease during this period to about 2.5. The pH was adjusted to 8.0 with 1N NaOH, and 8.2 g sodium bisulfite was dissolved in the reaction mixture. Heating was maintained for 15 minutes while stirring. The reaction mixture was poured into a pyrex beaker and cooled to room temperature thus completing the encapsulation process. Separation of the microcapsules was as described in Procedure 2. Freeze-dried a 100.0 g portion of the purified microcapsule slurry to obtain 23.2 g dry microcapsules.

Procedure 12

Procedure 11 is repeated except that into the aqueous solution at 60° C. is emulsified 150 mL dibutyl phthalate containing 20.0% triphenylphosphine.

Procedure 13

Procedure 11 is repeated except that into the aqueous solution at 60° C. is emulsified 150 mL trimethylolpropanetrimethacrylate.

Procedure 14

Procedure 11 is repeated except that into the aqueous solution at 60° C. is emulsified 150 mL dibutyl phthalate containing 15% BME.

Procedure 15

A 13.4 g portion of poly(ethylene-co-maleic anhydride) described in Procedure 1 was hydrolyzed in 250.7 g water to yield a transparent solution. The resulting solution was poured into a Waring blender, 8.0 g gum arabic was added, and the pH was adjusted to 4.0 with 1N HCl. The solution was heated to 60° C. and 21.4 g urea and 2.8 g resorcinol were added. Into this aqueous solution was emulsified 150 mL dibutyl phthalate containing 0.5 g toluene diisocyanate. 58.4 g of 37% formaldehyde solution was added, HCl, and the reaction heated for 1 hour. Another 10.7 g of formaldehyde solution was added and heated for 1 hour. After adding a solution of 2.5 g ammonium sulfate in 46.0 g water, the reaction mixture was heated for another hour. The pH was allowed to decrease during this period to about 2.5. The pH was adjusted to 8.0 with 1N NaOH, and 8.2 g sodium bisulfite was dissolved in the reaction mixture. Heating was maintained for 15 minutes while stirring. The reaction mixture was poured into a pyrex beaker and cooled to room temperature thus completing the encapsulation process. Separation of the microcapsules was as described in Procedure 2. Freeze-dried a 100.0 g portion of the purified microcapsule slurry to obtain 23.3 g dry microcapsules.

Procedure 16

Procedure 15 is repeated except that into the aqueous solution at 60° C. is emulsified 150 mL dibutyl phthalate containing 20.0% triphenylphosphine.

Procedure 17

Procedure 15 is repeated except that into the aqueous solution at 60° C. is emulsified 150 mL TMPTA.

Procedure 18

Procedure 15 is repeated except that into the aqueous solution at 60° C. is emulsified 150 mL dibutyl phthalate containing 15% BME.

EXAMPLE 1

An element was prepared by coating on about 0.001 inch (~0.025 mm) thick polyethylene terephthalate a slurry consisting of 35.0 ml of the microcapsule mixture prepared as described in Procedure 1 and a 34.7 g portion of a composition consisting of 200 ml water, 10.7 g polyvinyl alcohol, 87–89% hydrolysis, E. I. du Pont de Nemours and Company, Wilmington, DE, 15 g polyethylene glycol 400 diacrylate, 1.0 10% solution of saponin, 2 g polyoxyethylated trimethylolpropane triacrylate (TEOTA), 0.7 g bis-(2-o-chlorophenyl-4,5-diphenylimidazole), and 0.6 g 2-mercaptobenzoxazole (2-MBO).

After air drying the element, two samples were cut therefrom. Sample A had pressure applied manually by rubbing a scissors handle over the film while pressing downward and Sample B was not pressure treated. Both samples were exposed under a 0.0005 inch (0.013 mm) polyethylene terephthalate coversheet through a √2 stepwedge in a Berkey-Ascor vacuum frame system equipped with a 2 KW Addalux ® mercury photopolymer lamp mounted at a distance of 38 inches (96.5 cm) from the film and developed by water wash-off for 3 minutes. Sample A showed polymerization had occurred through step 15 whereas Sample B had polymerized through step 7.

EXAMPLE 2

To a 46.7 g aliquot from the following composition:

| Ingredient | Amount (g) |
| --- | --- |
| Water | 186.8 |
| Polyvinyl alcohol described in Ex. 1 | 9.4 |
| TEOTA | 3.0 |
| Saponin (10% water solution) | 1.2 |
| Polyethylene glycol 400 diacrylate | 13.8 |
| Imidazole compound described in Ex. 1 and | 1.0 |
| 2-MBO, dispersed from tetrahydrofuran (THF) 10 g | 0.8 | was added 10.0 ml of the microcapsule mixture prepared as described in Procedure 1. This mixture was coated on the polyethylene terephthalate support described in Example 1 and after air drying Samples A, B, C, and D were cut from the element. The samples were exposed and developed as described in Example 1. Samples A and C were not pressure treated. Samples B and D were passed through a Cromalin ® laminator (heated to 110° C.) and 8 and 10 times, respectively. Samples A and C developed through step 3, Sample B through step 7, and Sample D through step 9.

EXAMPLE 3

An element was prepared by coating a slurry consisting of 2.0 g of the microcapsules prepared as described in Procedure 2 in 15 g of the following photopolymerizable composition:

| Ingredient | Amount (g) |
| --- | --- |
| Water | 100.0 |
| Polyvinyl alcohol, 85.1–89.0% hydrolysis, Mn 10,000, Monsanto | 9.0 |
| TEOTA | 2.4 |
| Saponin (10% water solution) | 1.8 |
| Polyethylene glycol 400 diacrylate | 8.4 | onto a polyethylene terephthalate described in Example 1 through a 0.005 inch (0.13 mm) doctor knife. The element was air dried, cut into strips, Samples A and B, and exposed as described in Example 1. The strips were developed after the exposure by water wash-off for 30 seconds. Sample A was not pressure treated before exposure. Sample B, however, had manual pressure applied to it prior to exposure. Upon development Sample A imaged through step 12, whereas Sample B imaged through step 18.

EXAMPLE 4

An element was prepared by coating a slurry consisting of 2.0 g of the microcapsules prepared as described in Procedure 3 in 15 g of the following photopolymerizable composition:

| Ingredient | Amount (g) |
| --- | --- |
| Water | 100.0 |
| Polyvinyl alcohol described in Ex. 3 | 9.0 |
| TEOTA | 2.4 |
| Saponin (10% water solution) | 1.8 |
| Polyethylene glycol 400 diacrylate | 8.0 | on the polyethylene terephthalate described in Example 1 through a 0.005 inch (0.013 mm) doctor knife. The element was air dried, cut into strips, Samples A and B, and exposed as described in Example 1. The strips were developed after the exposure by water wash-off for 20 seconds. Sample A was not pressure treated before exposure. Sample B, however, had manual pressure applied to it prior to exposure. Upon development, Sample A imaged through step 6, whereas Sample B imaged through step 9.

EXAMPLE 5

An element was prepared by coating a slurry consisting of 6.0 g of the microcapsules prepared as described in Procedure 4 in 10.9 g of the following photopolymerizable composition:

| Ingredient | Amount (g) |
| --- | --- |
| Water | 107.7 |
| Polyvinyl alcohol described in Ex. 3 | 9.3 |
| TEOTA | 2.9 |
| Saponin (10% water solution) | 2.6 |
| Polyethylene glycol 400 diacrylate | 9.3 |
| Imidazole compound described in Ex. 1 | 0.6 |
| 2-MBO | 0.5 | on the polyethylene terephthalate support described in Example 1 through a 0.002 inch (0.05 nm) doctor knife.

The element was air dried, cut into strips, Samples A and B, and exposed as described in Example 1. The strips were developed after the exposure by water wash-off for 20 seconds. Sample A was not pressure treated before exposure. Sample B, however, had manual pressure applied to it prior to exposure. After development, Sample A imaged through step 1, whereas Sample B imaged through step 6.

EXAMPLE 6

An element prepared by coating a slurry consisting of 2.1 g of the microcapsules prepared as described in Procedure 5 in 18.0 of the following photopolymerizable composition:

| Ingredient | Amount (g) |
| --- | --- |
| Water | 101.2 |
| Polyvinyl alcohol described in Ex. 3 | 9.1 |
| TEOTA | 2.8 |
| Saponin (10% water solution) | 1.8 |
| Polyethylene glycol 400 diacrylate | 11.0 | onto the polyethylene terephthalate support described in Example 1 through a 0.008 inch (0.20 mm) doctor knife. The element was air dried, cut into strips, Samples A and B, and exposed as described in Example 1. The strips were developed after exposure by water wash-off for 30 seconds. Sample A was not pressure treated before exposure. Sample B, however, had manual pressure applied to it prior to exposure. Upon development, Sample A showed that no image formation had occurred, whereas B imaged through step 5.

EXAMPLE 7

An element was prepared by coating a slurry consisting of 5.4 g of the microcapsule prepared as described in Procedure 6 in 10.9 g of the following photopolymerizable composition:

| Ingredient | Amount (g) |
| --- | --- |
| Water | 101.6 |
| Polyvinyl alcohol described in Ex. 3 | 9.7 |
| Saponin (10% water solution) | 1.7 |
| Polyethylene glycol 400 diacrylate | 1.7 |
| Bis-[2,4-di-o-chlorophenyl-5-(3',4'-dimethoxyphenyl)-imidazole, and | 2.0 |
| 2-MBO, dispersed from acetone, 10 g. | 1.9 | on the polyethylene terephthalate support described in Example 1 through a 0.005 inch (0.13 mm) doctor knife. The element was air dried, into strips, Samples A and B, and exposed as described in Example 1. The strips were developed after exposure by water wash-off for 15 seconds. Sample A was not pressure treated before exposure. Sample B, however, had manual pressure applied to it prior to exposure. Upon development, Sample A showed no image formation, whereas Sample B imaged through step 10.

EXAMPLE 8

A photopolymerizable composition was made from the following ingredients:

| Ingredient | Amount (g) |
| --- | --- |
| Polyvinyl alcohol described in Ex. 3 (5% solution) | 1.9 |
| Polyethylene glycol 400 diacrylate | 0.3 |
| Saponin (10% water solution) | 0.1 | to which was added 7.2 g of microcapsules prepared as described in Procedure 6, and 2.8 g of microcapsules prepared as described in Procedure 7. The composition was coated onto the polyethylene terephthalate support described in Example 1 through a 0.005 inch (0.13 mm) doctor knife. The element was air dried, cut into strips, Samples A, B, and C, and exposed as described in Example 1. The strips were developed after exposure by water wash-off for 30 seconds. Sample A was not pressure treated before exposure. Samples B and C, however, had pressure applied to them prior to exposure. Upon development, Sample A showed no image formation, whereas both Samples B and C imaged through step 8.

EXAMPLE 9

To a 10.2 g aliquot from the following composition:

| Ingredient | Amount |
| --- | --- |
| Water | 96.5 g |
| Polyvinyl alcohol described in Ex. 1 | 10.7 g |
| TEOTA | 2.5 g |
| Polyethylene glycol 400 diacrylate | 12.2 g | was added 1.0 g of freeze-dried microcapsules prepared as described in the Procedure 8 for Polyamide Capsules. This mixture was coated on the polyethylene terephthalate support described in Example 1 and after air drying Samples A and B were cut from the element. The samples were exposed and developed as described in Example 1. Sample B was not pressure treated. Sample A had manual pressure applied to it prior to exposure. After exposure, the strips were developed by water wash-off for 15 seconds. Sample A imaged through step 8, whereas Sample B imaged through step 2.

EXAMPLE 10

An element is prepared by coating a slurry consisting of 1.0 g of the microcapsules prepared as described in Procedure 12 in 10.0 g of the following photopolymerizable composition:

| Ingredient | Amount (g) |
| --- | --- |
| Methylene Chloride | 200.1 |
| Polymethylmethacrylate Mn 100,000 | 12.8 |
| Polyvinylacetate Mn 12,000 | 5.1 |
| Trimethylolpropane-trimethacrylate | 14.4 |
| TEOTA | 3.1 |
| Polyethylene glycol lauryl ether surfactant | 3.1 |
| Imidazole compound described in Ex. 1 | 0.6 |
| 2-MBO | 0.21 | on the polyethylene terephthalate support described in Example 1 through a 0.002 inch (0.05 nm) doctor knife).

The element is air dried, the coversheet applied, and cut into sample strips. The strips are exposed, the coversheet removed, and the image visualized by manual toning with a pigment.

EXAMPLE 11

An element is prepared by coating a slurry consisting of 1.0 g of the microcapsules prepared as described in Procedure 14 in 10.0 g of the following photopolymerizable composition:

| Ingredient | Amount (g) |
| --- | --- |
| Methylene Chloride | 200.1 |
| Polymethylmethacrylate $\overline{Mn}$ 100,000 | 12.8 |
| Polyvinylacetate $\overline{Mn}$ 12,000 | 5.1 |
| Trimethylolpropane-trimethacrylate | 14.4 |
| TEOTA | 3.1 |
| Polyethylene glycol lauryl ether surfactant | 3.1 |
| Imidazole compound described in Ex. 1 | 0.6 |
| Hydroquinone | 0.021 | on the polyethylene terephthalate support described in Example 1 through a 0.002 inch (0.05 nm) doctor knife. The element is air dried, the coversheet applied, and cut into sample strips. The strips are exposed, the coversheet removed, and the image developed by manual toning with a pigment.

EXAMPLE 12

An element is prepared by coating a slurry consisting of 1.0 g of the microcapsules prepared as described in Procedure 13 in 10.0 g of the following photopolymerizable composition:

| Ingredient | Amount (g) |
| --- | --- |
| Methylmethacrylate/ethylacrylate/acrylic acid 55/38/7 $\overline{Mn}$ 57,000 Goodrich | 2.5 |
| Methylmethacrylate/ethylacrylate/acrylic acid 55/38/7 $\overline{Mn}$ 200,000 Goodrich | 4.0 |
| Styrene maleic anhydride half ester $\overline{Mn}$ 10,000 | 6.0 |
| Trimethylolpropane-trimethacrylate | 5.4 |
| Imidazole compound described in Ex. 1 | 0.4 |
| Michler's ketone | 0.1 |
| Benzophenone | 1.0 |
| Victoria Green | 0.01 |
| Benzotriazole | 0.1 |
| p-toluenesulfonic acid | 0.02 |
| Leuco Crystal Violet | 0.1 |
| Methylene chloride | 200.0 | on the polyethylene terephthalate support described in Example 1 through a 0.01 inch (0.25 nm) doctor knife. The element is air dried, the coversheet applied, and cut into sample strips. The strips are exposed, the coversheet removed, and the image developed by wash-off in an alkaline bath.

EXAMPLE 13

An element is prepared by coating a slurry consisting of 1.0 g of the microcapsules prepared as described in Procedure 12 in 10.0 g of the following photopolymerizable composition:

| Ingredient | Amount (g) |
| --- | --- |
| Methylmethacrylate/ethylacrylate/acrylic acid 55/38/7 $\overline{Mn}$ 57,000 Goodrich | 2.5 |
| Methylmethacrylate/ethylacrylate/acrylic acid 55/38/7 $\overline{Mn}$ 200,000 Goodrich | 4.0 |
| Styrene maleic anhydride half ester $\overline{Mn}$ 10,000 | 6.0 |
| Trimethylolpropane-trimethacrylate | 5.4 |
| Imidazole compound described in Ex. 1 | 0.4 |
| Michler's ketone | 0.1 |
| Benzophenone | 1.0 |
| Victoria Green | 0.01 |
| Benzotriazole | 0.1 |
| p-toluenesulfonic acid | 0.02 |
| Leuco Crystal Violet | 0.1 |
| Methylene chloride | 200.0 | on the polyethylene terephthalate support described in Example 1 through a 0.01 inch (0.25 nm) doctor knife. The element is air dried, the coversheet applied, and cut into sample strips. The strips are exposed, the coversheet removed, and the image developed by wash-off in an alkaline bath.

EXAMPLE 14

Samples prepared by the procedures indicated in Table 1 below were stirred in 30 mL of methylene chloride for a designated amount of time. The mixture was then vacuum filtered through a fine grade sintered glass filter, rotary evaporated the methylene chloride to yield residual oil extracted from the microcapsules which was weighed.

The total amount of internal oil phase for each microcapsule sample was determined by one of the following methods.

A. A sample of the freeze-dried microcapsules was crushed in a bottle with a blunt plastic rod for 3 to 5 minutes. Then into the bottle was added 30 mL of methylene chloride and the sample was stirred for a specified time period. The mixture was then vacuum filtered through a fine grade sintered glass filter, the methylene chloride removed by rotary evaporation, and the residual oil weighed.

B. A sample of the freeze-dried microcapsules were stirred in 30 mL of methylene chloride for 1 hour and then vacuum filtered through a fine grade sintered glass filter. Saved the filtrate for later use. The collected solids were crushed with a mortar and pestle, placed the crushed solids in a bottle, rinsed the mortar and pestle with several portions of methylene chloride which were poured into the bottle with the crushed solids. Added another 30 mL of methylene chloride to the mixture and stirred for 2 hours. The mixture was then filtered through the sintered glass filter previously used, this filtrate was combined with that previously obtained, the solvent removed by rotary evaporation, and the amount of residual oil determined.

The percentage of oil retained in the capsules could then be calculated as follows:

% Oil retained = [Total % Oil in Sample) — (% Oil Extracted)] — (Total % Oil in Sample)

The results obtained are shown in the table below:

TABLE 1

| Sample from Procedure | Total % Oil in Microcapsules | Procedure Used to Determine the Total % Oil | % Oil Retained/ (Time, Minutes) |
|---|---|---|---|
| 9 | 66.1 | A | 0/2 |
| 10 | 55.5 | A | 68.5/2 |
| 11 | 58.3 | B | 94.5/5 |
| 11 | 58.3 | B | 84.9/60 |
| 15 | 76.5 | B | 94.0/5 |
| 15 | 76.5 | B | 89.9/60 |

We claim:

1. In a photopolymerizable element comprising a support bearing, in order, a layer of a photopolymerizable composition, and a protective layer, the improvement wherein dispersed in the photopolymerizable layer are pressure rupturable microcapsules consisting essentially of outer walls resistant to solvent for the photopolymerizable layer surrounding at least one active component for the photopolymerizable composition which improves the speed and/or physical properties of the photopolymerizable composition.

2. A photopolymerizable element according to claim 1 wherein the active component of the microcapsule is present in a water immiscible oil.

3. A photopolymerizable element according to claim 1 wherein the active component for the photopolymerizable composition is a compound taken from the group consisting essentially of a nongaseous ethylenically unsaturated compound, sensitizer, photoinitiator, oxygen scavenger, plasticizer, and combinations thereof.

4. In a photopolymerizable element comprising a support bearing, in order, a layer of a photopolymerizable composition, and a protective layer, the improvement wherein the photopolymerizable layer has in contact with a surface of the photopolymerizable layer pressure rupturable microcapsules consisting essentially of outer walls resistant to solvent for the photopolymerizable layer surrounding at least one active component for the photopolymerizable composition which improves the speed and/or physical properties of the photopolymerizable composition.

5. A photopolymerizable element according to claim 4 wherein the active component of the microcapsule is present in a water immiscible oil.

6. A photopolymerizable element according to claim 1 wherein the photopolymerizable composition present as a layer on the support comprises: (1) a polymeric organic binder, (2) a nongaseous ethylenically unsaturated compound, and (3) a photoinitiator or photoinitiator system.

7. A photopolymerizable element according to claim 6 wherein the layer on the support comprises at least (1) a polymeric organic binder, and (3) a photoinitiator or photoinitiator system, the ethylenically unsaturated compound (2), being contained within the pressure rupturable microcapsules in reactive association with the said layer.

8. A photopolymerizable element according to claim 6 wherein the layer on the support comprises at least (1) a polymeric organic binder, and (2) an ethylenically unsaturated compound, the photoinitiator or photoinitiator system (3) being contained within the pressure rupturable microcapsules in reactive association with the said layer.

9. A process for the preparation of an activated photopolymerizable element which comprises:
(a) applying to a support a layer of a photopolymerizable composition having dispersed therein pressure rupturable microcapsules consisting essentially of outer walls resistant to solvent for the photopolymerizable layer surrounding at least one active component for the photopolymerizable composition which improves the speed and/or physical properties of the photopolymerizable composition;
(b) drying the photopolymerizable layer;
(c) optionally applying a protective layer over the photopolymerizable layer; and
(d) applying sufficient pressure to rupture substantially all the pressure rupturable microcapsules.

10. A process according to claim 9 wherein after step (d) the photopolymerizable element is (e) imagewise exposed to actinic radiation for the photopolymerizable layer, and (f) the unexposed areas are completely removed by development in a solvent for the photopolymerizable layer or toned with a pigment.

11. A process for the preparation of an activated photopolymerizable element which comprises
(a) applying to a support a layer of a photopolymerizable composition,
(b) drying the photopolymerizable layer;
(c) applying a protective layer over the photopolymerizable layer, the photopolymerizable layer having in reactive association therewith pressure rupturable microcapsules consisting essentially of outer walls resistant to solvent for the photopolymerizable layer surrounding at least one active component for the photopolymerizable composition which improves the speed and/or physical properties of the photopolymerizable composition, and
(d) applying sufficient pressure to rupture substantially all the pressure rupturable microcapsules.

12. A process according to claim 11 wherein after step (d) the photopolymerizable element is (e) imagewise exposed to actinic radiation for the photopolymerizable layer, and (f) the unexposed areas are completely removed by development in a solvent for the photopolymerizable layer or otned with a pigment.

13. A process according to claim 11 wherein the pressure rupturable microcapsules are present on the support of the photopolymerizable element in contact with the photopolymerizable layer.

14. A process according to claim 11 wherein the pressure rupturable microcapsules are present on the surface of the photopolymerizable layer adjacent to the protective layer.

15. A process according to claim 11 wherein the active component of the microcapsule is present in a water immiscible oil.

16. A process according to claim 1 wherein the active component for the photopolymerizable composition is a compound taken from the group consisting essentially of a nongaseous ethylenically unsaturated compound, sensitizer, photoinitiator, oxygen scavenger, plasticizer and combinations thereof.

17. A process according to claim 11 wherein the photopolymerizable layer present as a layer on the support comprises: (1) a polymeric organic binder, (2) a nongaseous ehtylenically unsaturated compound, and (3) a photoinitiator or photoinitiator system.

18. A process according to claim 17 wherein the layer on the support comprises at least (1) a polymeric organic binder, and (3) a photoinitiator or photoinitiator system, the ethylenically unsaturated compound (2) being contained within the pressure rupturable microcapsules in reactive association with the said layer.

19. A process according to claim 17 wherein the layer on the support comprises at least (1) a polymeric organic binder, and (2) an ethylenically unsaturated compound, the photoinitiator or photoinitiator system (3) being contained within the pressure rupturable microcapsules in reactive association with the said layer.

20. A photopolymerizable element according to claim 4 wherein the active component for the photopolymerizable composition is a compound taken from the group consisting essentially of a nongaseous ethylenically unsaturated compound, sensitizer, photoinitiator, oxygen scavenger, plasticizer, and combinations thereof.

21. A photopolymerizable element according to claim 4 wherein the photopolymerizable composition present as a layer on the support comprises: (1) a polymeric organic binder, (2) a nongaseous ethylenically unsaturated compound, and (3) a photoinitiator or photoinitiator system.

22. A photopolymerizable element according to claim 21 wherein the layer on the support comprises at least (1) a polymeric organic binder, and (3) a photoinitiator or photoinitiator system, the ethylenically unsaturated compound (2), being contained within the pressure rupturable microcapsules in reactive association with the said layer.

23. A photopolymerizable element according to claim 21 wherein the layer on the support comprises at least (1) a polymeric organic binder, and (2) an ethylenically unsaturated compound, the photoinitiator or photoinitiator system (3) being contained within the pressure rupturable microcapsules in reactive association with the said layer.

* * * * *

UNITED STATES PATENT AND TRADEMARK OFFICE
CERTIFICATE OF CORRECTION

PATENT NO. : 4,636,453
DATED : January 13, 1987
INVENTOR(S) : Dalen E. Keys and William J. Nebe It is certified that error appears in the above-identified patent and that said Letters Patent is hereby corrected as shown below:

Column 22, line 43, "otned" should be -- toned --.

Column 22, line 55, "1" should be -- 11 --.

Signed and Sealed this

Twenty-eighth Day of April, 1987

Attest:

DONALD J. QUIGG

Attesting Officer

Commissioner of Patents and Trademarks